US012731760B2

(12) United States Patent
Kohashi et al.

(10) Patent No.: US 12,731,760 B2
(45) Date of Patent: Sep. 8, 2026

(54) SPIN-POLARIZED SCANNING ELECTRON MICROSCOPE

(71) Applicant: Hitachi High-Tech Corporation, Tokyo (JP)

(72) Inventors: Teruo Kohashi, Tokyo (JP); Hideo Morishita, Tokyo (JP); Takashi Ohshima, Tokyo (JP); Makoto Kuwahara, Nagoya (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 354 days.

(21) Appl. No.: 18/290,321

(22) PCT Filed: Jul. 30, 2021

(86) PCT No.: PCT/JP2021/028244
§ 371 (c)(1),
(2) Date: Nov. 13, 2023

(87) PCT Pub. No.: WO2023/007687
PCT Pub. Date: Feb. 2, 2023

(65) Prior Publication Data
US 2024/0249911 A1 Jul. 25, 2024

(51) Int. Cl.
*H01J 37/285* (2006.01)
*G01N 23/2251* (2018.01)
(Continued)

(52) U.S. Cl.
CPC ........ *H01J 37/285* (2013.01); *G01N 23/2251* (2013.01); *H01J 37/265* (2013.01);
(Continued)

(58) Field of Classification Search
CPC ........ H01J 37/265; H01J 37/285; H01J 37/28; H01J 37/244; H01J 2237/06383;
(Continued)

(56) References Cited

U.S. PATENT DOCUMENTS

2008/0210868 A1 9/2008 Kohashi et al.
2008/0217533 A1* 9/2008 Kohashi ............ G01N 23/2251 324/319
(Continued)

FOREIGN PATENT DOCUMENTS

JP 2008-218063 A 9/2008
JP 2008-251525 A 10/2008
(Continued)

OTHER PUBLICATIONS

International Search Report of PCT/JP2021/028244 dated Oct. 19, 2021.

*Primary Examiner* — David E Smith
(74) *Attorney, Agent, or Firm* — MATTINGLY & MALUR, PC

(57) ABSTRACT

Provided is a spin-polarized scanning electron microscope capable of improving an SNR of a detected signal. The spin-polarized scanning electron microscope includes: a spin-polarized electron source configured to irradiate a sample with a spin-polarized electron beam that is an electron beam whose spin is deflected in a specific direction; a scanning unit configured to scan the sample by deflecting the spin-polarized electron beam; a spin detector configured to detect a spin direction of an emitted electron that is an electron emitted from the sample scanned with the spin-polarized electron beam; and a control unit configured to control the spin direction to be detected by the spin detector based on the spin direction of the spin-polarized electron beam.

7 Claims, 6 Drawing Sheets

(51) Int. Cl.
*H01J 37/26* (2006.01)
*H01J 37/28* (2006.01)

(52) U.S. Cl.
CPC ...... *H01J 37/28* (2013.01); *G01N 2223/3301* (2013.01); *G01N 2223/612* (2013.01); *H01J 2237/06383* (2013.01); *H01J 2237/0653* (2013.01); *H01J 2237/24557* (2013.01); *H01J 2237/2812* (2013.01)

(58) Field of Classification Search
CPC ...... H01J 2237/0653; H01J 2237/2812; G01N 2223/3301; G01N 2223/612
See application file for complete search history.

(56) References Cited

U.S. PATENT DOCUMENTS

| | | | | |
|---|---|---|---|---|
| 2013/0009058 | A1* | 1/2013 | Tanaka | H01J 37/073<br>250/311 |
| 2018/0174795 | A1* | 6/2018 | Kohashi | H01J 37/09 |
| 2020/0402762 | A1* | 12/2020 | Kohashi | H01J 37/268 |

FOREIGN PATENT DOCUMENTS

| | | | | |
|---|---|---|---|---|
| JP | 2010003450 | A | * | 1/2010 |
| JP | 5626694 | B2 | | 11/2014 |
| JP | 2017004774 | A | * | 1/2017 |
| WO | 2016/207961 | A1 | | 12/2016 |

* cited by examiner

[FIG. 1]
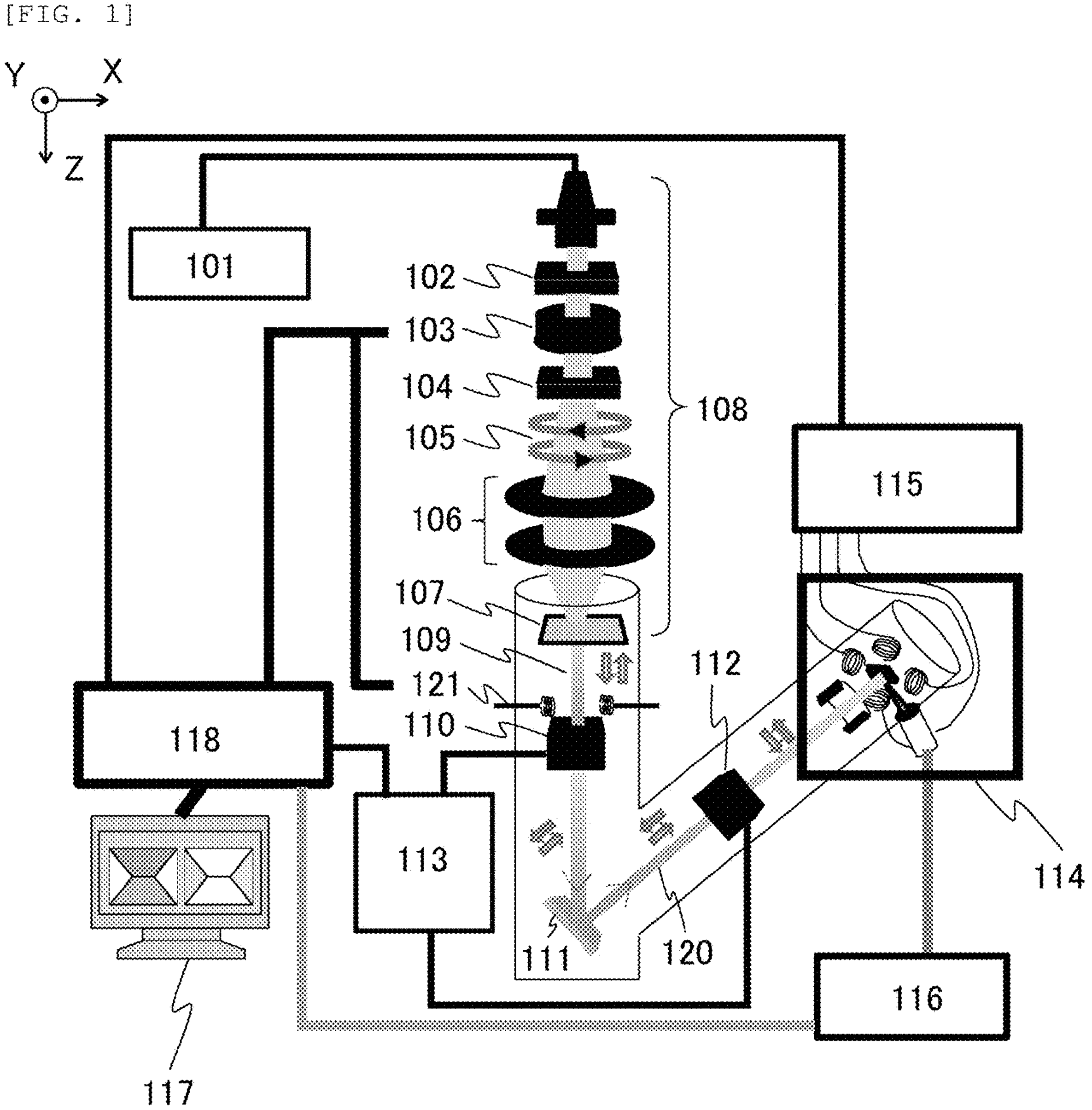

[FIG. 2]
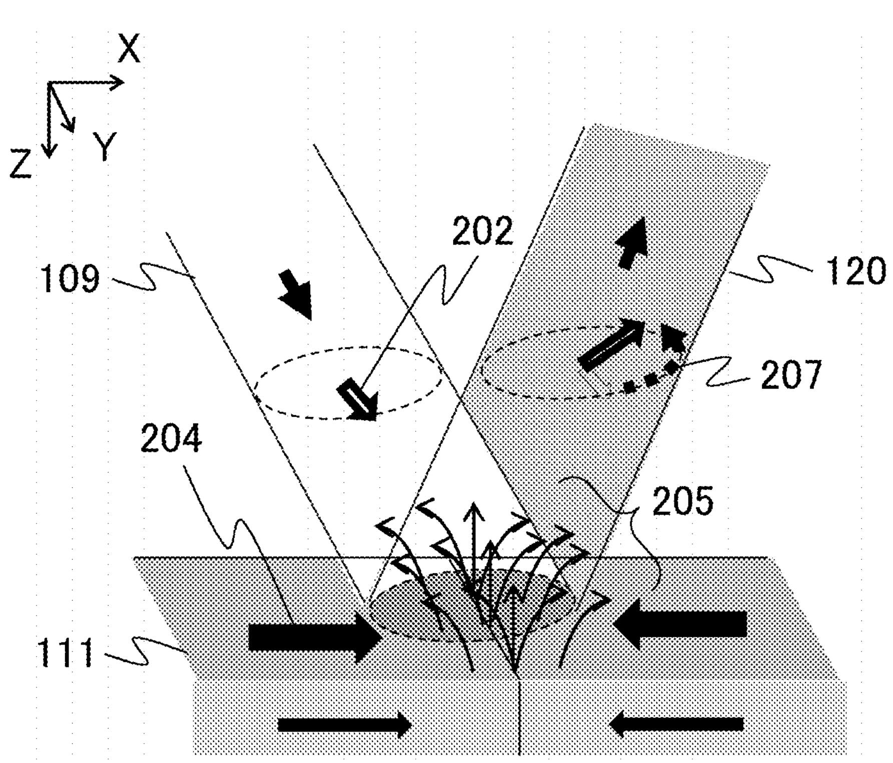

[FIG. 3]
(1) SAMPLE
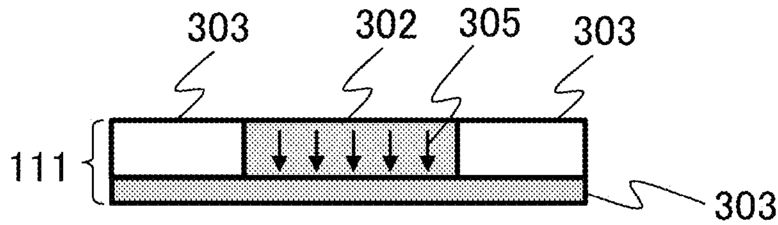
(2) IRRADIATION WITH SPIN-POLARIZED ELECTRON BEAM
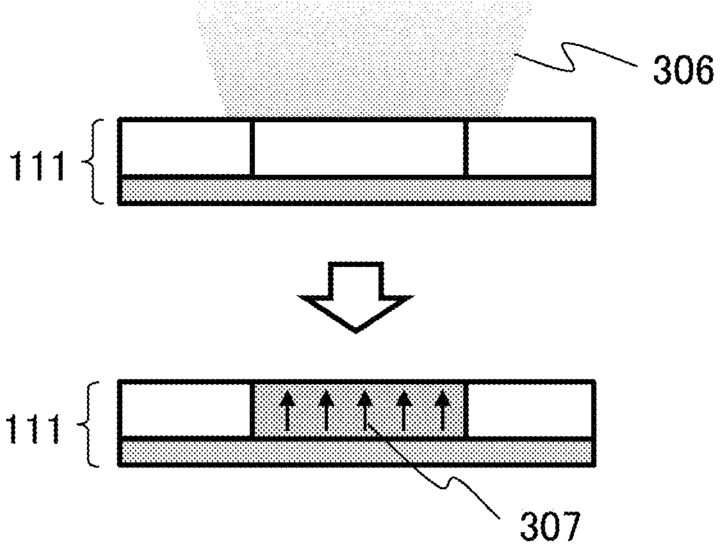
(3) MEASUREMENT
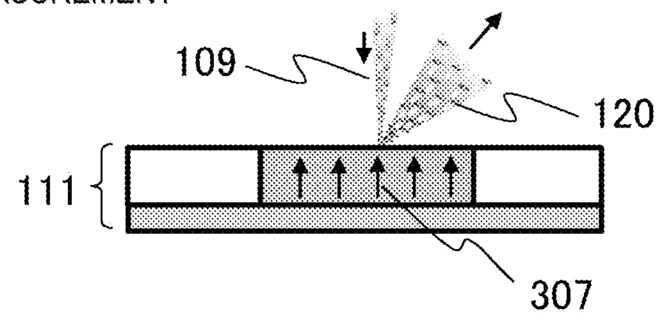

[FIG. 4A]
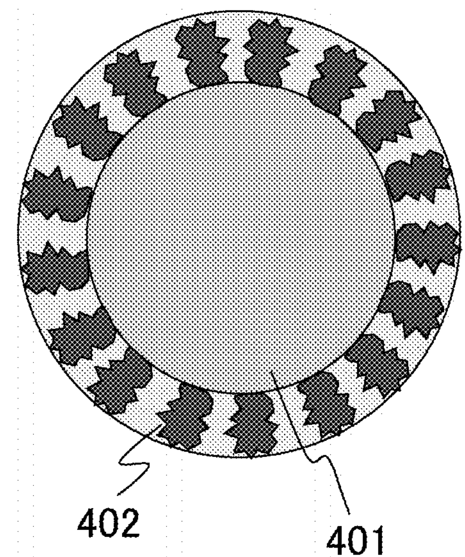
[FIG. 4B]
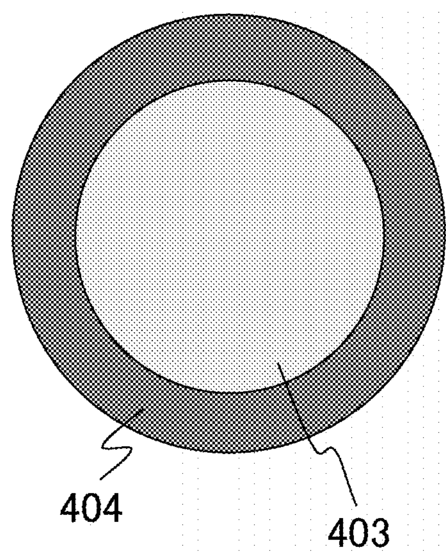

[FIG. 5]
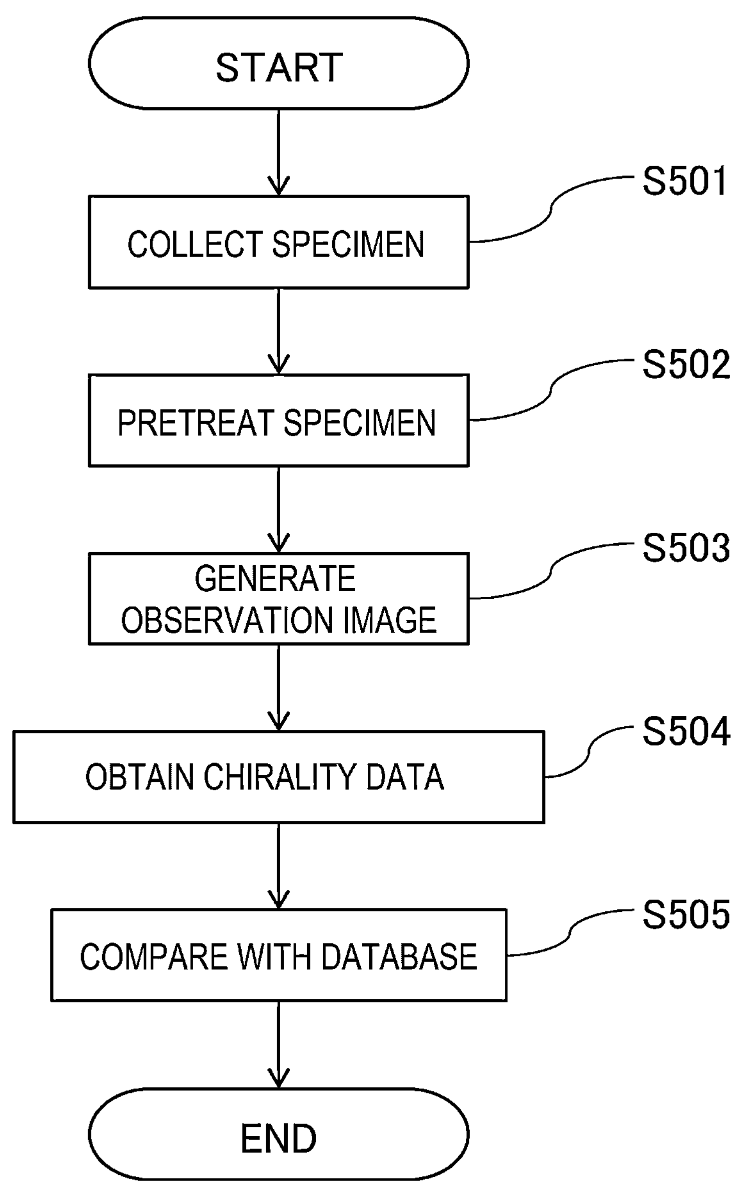

[FIG. 6]

| TYPE OF VIRUS | CHIRALITY DATA | | | | | |
|---|---|---|---|---|---|---|
| | CENTRAL PORTION (CORE) | | | PERIPHERAL PORTION (CAPSID) | | |
| | DIRECTION | PERIOD (nm) | INTENSITY (%) | DIRECTION | PERIOD (nm) | INTENSITY (%) |
| COVI-19 | D1 | L1 | I1 | D2 | L2 | I2 |
| HIV | D3 | L3 | I3 | D4 | L4 | I4 |
| HEPATITIS | D5 | L5 | I5 | D6 | L6 | I6 |

SPIN-POLARIZED SCANNING ELECTRON MICROSCOPE

TECHNICAL FIELD

The present invention relates to a spin-polarized scanning electron microscope that scans a sample with a spin-polarized electron beam. The spin-polarized electron beam is an electron beam whose spin is deflected in a specific direction.

BACKGROUND ART

A spin-polarized electron microscope that observes a sample by irradiating the sample with a spin-polarized electron beam, which is an electron beam whose spin is deflected in a specific direction, can observe, for example, a magnetic domain structure of a magnetic material and a molecular structure of a protein and the like, but it is difficult to obtain a high-contrast image.

PTL 1 discloses a transmission electron microscope that obtains a high-contrast image by synchronizing reversing of a spin direction of a spin-polarized electron beam emitted to a sample with recording of an intensity distribution of an electron beam transmitted through the sample and obtaining a difference in electron beam intensity distribution before and after the reversing.

CITATION LIST

Patent Literature

PTL 1: JP5626694B

SUMMARY OF INVENTION

Technical Problem

However, the electron beam intensity distribution recorded in PTL 1 includes electrons whose spin directions are various, and an electron whose spin direction is different from the spin direction of the spin-polarized electron beam is detected as noise. When a lot of noise exists in a detected signal, a signal to noise ratio (SNR) decreases, and it becomes difficult to observe, for example, a magnetic domain structure of a magnetic material and a molecular structure of a protein and the like.

Therefore, an object of the invention is to provide a spin-polarized scanning electron microscope capable of improving an SNR of a detected signal.

Solution to Problem

In order to achieve the above object, the invention provides a spin-polarized scanning electron microscope including: a spin-polarized electron source configured to irradiate a sample with a spin-polarized electron beam that is an electron beam whose spin is deflected in a specific direction; a scanning unit configured to scan the sample by deflecting the spin-polarized electron beam; a spin detector configured to detect a spin direction of an emitted electron that is an electron emitted from the sample scanned with the spin-polarized electron beam; and a control unit configured to control the spin direction to be detected by the spin detector based on the spin direction of the spin-polarized electron beam.

Advantageous Effects of Invention

According to the invention, it is possible to provide a spin-polarized scanning electron microscope capable of improving an SNR of a detected signal.

BRIEF DESCRIPTION OF DRAWINGS

FIG. 1 is a diagram showing an example of an overall configuration of a spin-polarized scanning electron microscope.

FIG. 2 is a diagram showing measurement of a leakage magnetic field from a surface of a sample.

FIG. 3 is a diagram showing a procedure for measuring reversed magnetization.

FIG. 4A is a diagram showing a structural example of a virus.

FIG. 4B is a diagram showing an example of an observation image of the virus.

FIG. 5 is a diagram showing a flow of virus inspection processing.

FIG. 6 is a diagram showing an example of a database used for determining a type of the virus.

DESCRIPTION OF EMBODIMENTS

Hereinafter, examples of a spin-polarized scanning electron microscope according to the invention will be described with reference to the accompanying drawings. The spin-polarized scanning electron microscope is a device that observes a sample by scanning the sample with an electron beam whose spin is deflected in a specific direction.

Embodiment 1

An overall configuration of a spin-polarized scanning electron microscope in Embodiment 1 will be described with reference to FIG. 1. A vertical direction is a Z direction, and horizontal directions are an X direction and a Y direction. The spin-polarized scanning electron microscope includes a spin-polarized electron source 108, a scanning coil 121, a spin detector 114, and a control unit 118.

The spin-polarized electron source 108 is a device that irradiates a sample 111 with a spin-polarized electron beam 109. The spin-polarized electron beam 109 is an electron beam whose spin is deflected in a specific direction. The spin-polarized electron source 108 includes, for example, a laser light source 101, a polarizer 102, a phase modulator 103, a polarizer 104, a condenser lens 106, and a semiconductor superlattice 107. Excitation light emitted from the laser light source 101 becomes circularly polarized light 105 by passing through the polarizer 102, the phase modulator 103, and the polarizer 104, and is condensed by the condenser lens 106 to radiate the semiconductor superlattice 107. The semiconductor superlattice 107 is an electron source that emits the spin-polarized electron beam 109 by being irradiated with the circularly polarized light 105, and is a semiconductor such as GaAs or GaAsP. A spin direction of the spin-polarized electron beam 109 is controlled by a direction of the circularly polarized light 105 that is changed by an operation of the phase modulator 103. When left and right polarization directions of the circularly polarized light 105 are reversed, the spin direction of the spin-polarized electron beam 109 is also reversed.

The spin-polarized electron beam 109 emitted from the semiconductor superlattice 107 is deflected by a magnetic field formed by the scanning coil 121, and a field of view on a surface of the sample 111 is scanned with the deflected spin-polarized electron beam 109. A spin rotator 110 disposed between the scanning coil 121 and the sample 111 adjusts a spin angle of the spin-polarized electron beam 109 such that, for example, the spin direction is orthogonal to the surface of the sample 111. The spin rotator 110 adjusts the spin angle of the spin-polarized electron beam 109 using power supplied from a spin rotator driving power supply 113.

The spin detector 114 is a device that detects a spin direction of an emitted electron 120, and switches the spin direction to be detected using power supplied from a spin detector driving power supply 115. The emitted electron 120 is an electron emitted from the sample 111 scanned with the spin-polarized electron beam 109. The emitted electron 120 is a reflected electron or a secondary electron. The spin detector 114 may be connected to the control unit 118 via a lock-in amplifier 116. A spin rotator 112 disposed between the sample 111 and the spin detector 114 adjusts a spin angle of the emitted electron 120 such that, for example, the spin direction is parallel to a detection surface of the spin detector 114. The spin rotator 112 adjusts the spin angle of the emitted electron 120 using the power supplied from the spin rotator driving power supply 113.

The control unit 118 is a device that controls the phase modulator 103, the scanning coil 121, the spin rotator driving power supply 113, the spin detector driving power supply 115, and the like, and is, for example, a microprocessing unit (MPU). The control unit 118 causes an image display device 117 to display an observation image that is generated based on a signal detected by the spin detector 114.

In order to display the observation image more clearly, it is preferable to improve a signal to noise ratio (SNR) by reducing noise of the detected signal. Therefore, in Embodiment 1, the spin direction to be detected by the spin detector 114 is controlled based on the spin direction of the spin-polarized electron beam 109. More specifically, the spin detector 114 detects a spin in the same direction as the spin direction of the spin-polarized electron beam 109. By matching the spin direction of the spin-polarized electron beam 109 with the spin direction of the emitted electron 120, only a necessary component is detected, and the noise is reduced, and thus the SNR can be improved. Further, the SNR may be improved by causing the spin detector 114 to perform detection in synchronization with fluctuation of the spin-polarized electron beam 109 by using the lock-in amplifier 116.

The spin direction to be detected by the spin detector 114 is not limited to the same direction as the spin direction of the spin-polarized electron beam 109, and may be a direction obtained by reversing the spin direction of the spin-polarized electron beam 109 or a direction obtained by rotating the spin direction of the spin-polarized electron beam 109 by 90 degrees. That is, the spin direction to be detected by the spin detector 114 is switched according to an observation purpose. The spin direction of the spin-polarized electron beam 109 and the spin direction of the emitted electron 120 may be synchronized with the scanning performed with the spin-polarized electron beam 109 by the scanning coil 121.

As described above, according to Embodiment 1, the SNR of the detected signal can be improved by controlling the spin direction to be detected by the spin detector 114 based on the spin direction of the spin-polarized electron beam 109.

Embodiment 2

In Embodiment 2, measurement of a magnetic field leaking from a surface of the sample 111 will be described. In Embodiment 2, a part of configurations and functions described in Embodiment 1 can be applied, and thus the same configurations and functions are denoted by the same reference numerals and description thereof will be omitted.

The measurement of the leakage magnetic field from the surface of the sample 111 will be described with reference to FIG. 2. When the sample 111 has a magnetization 204, a leakage magnetic field 205 is generated on the surface of the sample 111. In a process in which the spin-polarized electron beam 109 emitted to the sample 111 is reflected by the surface of the sample 111, a spin 202 of the spin-polarized electron beam 109 performs a precession 207 by the leakage magnetic field 205. A rotation angle of the precession 207 depends on an intensity of the leakage magnetic field 205.

Therefore, In Embodiment 2, the spin detector 114 detects a spin direction of the emitted electron 120 with respect to a direction of the spin 202 of the spin-polarized electron beam 109. That is, a relative angle between the direction of the spin 202 of the spin-polarized electron beam 109 and the spin direction of the emitted electron 120 is the rotation angle of the precession 207, and the intensity of the leakage magnetic field 205 is obtained based on the rotation angle of the precession 207.

As described above, according to Embodiment 2, the intensity of the leakage magnetic field 205 is obtained based on the rotation angle of the precession 207 that is obtained by detecting the spin direction of the emitted electron 120 with respect to the direction of the spin 202 of the spin-polarized electron beam 109.

Embodiment 3

In Embodiment 3, measurement of a reversed magnetization will be described. In Embodiment 3, a part of configurations and functions described in Embodiment 1 can be applied, and thus the same configurations and functions are denoted by the same reference numerals and description thereof will be omitted.

A procedure for measuring the reversed magnetization will be described with reference to FIG. 3. The sample 111 is a memory element such as a magneto-resistive random access memory (MRAM). A pattern of a magnetic material 302 is formed in a non-magnetic material 303. The magnetic material 302 has a magnetization 305.

When an entire region of the magnetic material 302 of the sample 111 is irradiated with a pulsed spin-polarized electron beam 306, the magnetization 305 in the magnetic material 302 is reversed by, for example, a spin injection magnetization torque effect, and a reversed magnetization 307 is generated. An intensity of the pulsed spin-polarized electron beam 306 is preferably set according to a thickness and a coercive force of the magnetic material 302. That is, the intensity of the pulsed spin-polarized electron beam 306 is set to be larger as the thickness of the magnetic material 302 is larger or the coercive force is larger. The magnetization 305 can be sufficiently reversed by appropriately setting the intensity of the pulsed spin-polarized electron beam 306.

After the reversed magnetization 307 is generated, the spin detector 114 detects a spin of the emitted electron 120 emitted by irradiating the magnetic material 302 of the sample 111 with the spin-polarized electron beam 109. A direction and a magnitude of the reversed magnetization 307 are measured based on a signal detected by the spin detector. A temporal change of the reversed magnetization 307 is measured by continuously performing the irradiation performed with the spin-polarized electron beam 109 and the detection performed by the spin detector 114.

As described above, in Embodiment 3, the reversed magnetization 307 is generated by irradiating the sample 111 with the pulsed spin-polarized electron beam 306 before the detection performed by the spin detector 114. The reversed magnetization 307 is measured by the irradiation performed with the spin-polarized electron beam 109 and the detection performed by the spin detector 114. A write state of the storage element such as the MRAM can be easily evaluated by measuring the temporal change of the reversed magnetization 307.

Embodiment 4

In Embodiment 4, inspection for a virus will be described. In Embodiment 4, a part of configurations and functions described in Embodiment 1 can be applied, and thus the same configurations and functions are denoted by the same reference numerals and description thereof will be omitted.

A structural example of the virus will be described with reference to FIG. 4A. The virus includes a nucleus 401 and a capsid 402. The nucleus 401 includes deoxyribonucleic acid (DNA) or ribonucleic acid (RNA) and is located at a center of the virus. The capsid 402 includes a protein and is located around the nucleus 401. In many cases, DNA, RNA, and the protein have a chirality structure. A transmittance of an electron transmitted through the chirality structure changes depending on a spin direction of the electron. Therefore, an observation image reflecting the chirality structure can be generated by detecting the intensity and the spin direction of the emitted electron 120 that is emitted from the virus by the irradiation performed with the spin-polarized electron beam 109.

An example of the observation image of the virus will be described with reference to FIG. 4B. Since the nucleus 401 and the capsid 402 have different chirality structures, as shown in FIG. 4B, a difference occurs between a nucleus contrast 403 and a capsid contrast 404. Data related to the chirality structure can be obtained from the observation image shown in FIG. 4B, and the virus can be inspected based on the obtained data.

An example of a flow of virus inspection processing will be described with reference to FIG. 5.

(S501)

A specimen is collected from a mucous membrane of a throat or a nasal cavity of a subject.

(S502)

As a pretreatment for the specimen collected in S501, immersion for the specimen in triethylene glycol, immobilization for the specimen by blowing liquid nitrogen gas, and the like are performed. The sample 111 including the virus is prepared by performing the pretreatment.

(S503)

An observation image of the sample 111 created by the pretreatment in S502 is generated. That is, the sample 111 including the virus is irradiated with the spin-polarized electron beam 109, and the intensity and the spin direction of the emitted electron 120 emitted from the sample 111 are detected by the spin detector 114. The observation image as shown in FIG. 4B is generated based on a signal detected by the spin detector 114. Observation conditions such as an acceleration voltage of the spin-polarized electron beam 109 are adjusted as necessary.

(S504)

Chirality data is obtained from the observation image generated in S503. The chirality data includes the spin direction, a period of the chirality structure, and an intensity that is a ratio at which the chirality structure is formed.

(S505)

The chirality data obtained in S504 is compared with a database as shown in FIG. 6, and a type of the virus is determined. The database in FIG. 6 is a database in which chirality data obtained from an observation image of a known virus is recorded, and is created in advance. The database in FIG. 6 includes items such as a spin direction, a period of a chirality structure, and an intensity that is a ratio at which the chirality structure is formed. It is possible to determine types of a large number of viruses in a short time by including such specialized items in the chirality data.

As described above, according to Embodiment 4, the type of the virus can be determined by inspecting, based on the irradiation performed with the spin-polarized electron beam 109 and the detection performed by the spin detector 114, the specimen collected from the subject.

A plurality of examples of the invention have been described above. The invention is not limited to the above examples, and can be embodied by modifying constituent elements without departing from the gist of the invention. A plurality of constituent elements disclosed in the above embodiments may be combined appropriately. Further, a part of constituent elements may be deleted from all the constituent elements shown in the above embodiments.

REFERENCE SIGNS LIST

101: laser light source
102: polarizer
103: phase modulator
104: polarizer
105: circularly polarized light
106: condenser lens
107: semiconductor superlattice
108: spin-polarized electron source
109: spin-polarized electron beam
110: spin rotator
111: sample
112: spin rotator
113: spin rotator driving power supply
114: spin detector
115: spin detector driving power supply
116: lock-in amplifier
117: image display device
118: control unit
120: emitted electron
121: scanning coil
202: spin
204: magnetization
205: leakage magnetic field
207: precession
302: magnetic material
303: non-magnetic material
305: magnetization
306: spin-polarized electron beam
307: reversed magnetization
401: nucleus
402: capsid
403: nucleus contrast
404: capsid contrast

The invention claimed is:

1. A spin-polarized scanning electron microscope comprising:

a spin-polarized electron source configured to irradiate a sample with a spin-polarized electron beam that is an electron beam whose spin is deflected in a specific direction;

a scanning unit configured to scan the sample by deflecting the spin-polarized electron beam;

a spin detector configured to detect a spin direction of an emitted electron that is an electron emitted from the sample scanned with the spin-polarized electron beam; and a control unit configured to control the spin direction to be detected by the spin detector based on the spin direction of the spin-polarized electron beam, wherein the control unit controls, in synchronization with scanning performed by the scanning unit, the spin direction of the spin-polarized electron beam and the spin direction of the emitted electron to be detected by the spin detector.

2. The spin-polarized scanning electron microscope according to claim 1, wherein the control unit causes the spin detector to detect a spin in the same direction as the spin direction of the spin-polarized electron beam.

3. The spin-polarized scanning electron microscope according to claim 1, wherein the control unit causes the spin detector to detect the spin direction of the emitted electron with respect to the spin direction of the spin-polarized electron beam.

4. The spin-polarized scanning electron microscope according to claim 1, wherein the control unit causes the spin-polarized electron source to irradiate the sample with a pulsed spin-polarized electron beam before the detection performed by the spin detector.

5. The spin-polarized scanning electron microscope according to claim 4, wherein an intensity of the pulsed spin-polarized electron beam is set according to a thickness or a magnetic force of the sample on the beam electrons.

6. A spin-polarized scanning electron microscope comprising:

a spin-polarized electron source configured to irradiate a sample with a spin-polarized electron beam that is an electron beam whose spin is deflected in a specific direction;

a scanning unit configured to scan the sample by deflecting the spin-polarized electron beam;

a spin detector configured to detect a spin direction of an emitted electron that is an electron emitted from the sample scanned with the spin-polarized electron beam; and a control unit configured to control the spin direction to be detected by the spin detector based on the spin direction of the spin-polarized electron beam, wherein the sample includes a virus, and the control unit determines a type of the virus included in the sample by comparing chirality data of the virus obtained from a signal detected by the spin detector with a database in which chirality data of various viruses is recorded.

7. The spin-polarized scanning electron microscope according to claim 6, wherein the database includes, as items of the chirality data, a spin direction, a period of a chirality structure, and an intensity that is a ratio at which the chirality structure is formed.

* * * * *